United States Patent [19]

Gavrilov et al.

[11] Patent Number: 4,970,092

[45] Date of Patent: Nov. 13, 1990

[54] WEAR RESISTANT COATING OF CUTTING TOOL AND METHODS OF APPLYING SAME

[76] Inventors: Alexei G. Gavrilov, ulitsa Vostochnaya, II, kv.6., Domodedovo Moskovskaya oblast; Viktor P. Zhed, Uchebny pereulok, 2, kv.57., Moscow; Elena I. Kurbatova, ulitsa V. Ulbrikhta, 23/7, kv.378., Moscow; Andrei K. Sinelschikov, Leningradsky prospekt, 50, kv.47., Moscow; Evdokia M. Sokolovskaya, Lomonosovsky prospekt, I4, kv.6., Moscow; Vladimir B. Bozhukov, Tashkentskaya ulitsa, 22, korpus I, kv.203., Moscow; Albert M. Boyarunas, ulitsa Sverdlova, I54, kv.73., Kharkov, all of U.S.S.R.

[21] Appl. No.: 181,404

[22] Filed: Apr. 13, 1988

Related U.S. Application Data

[62] Division of Ser. No. 869,185, May 30, 1986, Pat. No. 4,753,854.

[51] Int. Cl.$^5$ .............................................. B05D 3/06
[52] U.S. Cl. ........................................ 427/37; 427/38
[58] Field of Search ..................................... 427/34, 37

[56] References Cited

U.S. PATENT DOCUMENTS

| | | | |
|---|---|---|---|
| 4,729,905 | 3/1988 | Zhed | 427/37 |
| 4,734,178 | 3/1988 | Gavrilov | 427/37 |

*Primary Examiner*—Sam Silverberg

[57] ABSTRACT

A wear-resistant coating of a cutting tool has at least a single layer of an interstitial phase which comprises alloying components and a non-metallic one the content which falls within the boundaries of a region wherein a compound of this interstitial phase having the greatest thermodynamic stability is homogeneous. One of the alloying components functions as a catalyst which facilitates the compound with the high thermodynamic stability to form. A method of applying the wear-resistant coating to a cutting tool provides for condensing matter by virtue of ion bombardment and consists in introducing the catalyst into a vacuum by evaporating the material of a cathode and depositing a layer of coating on the base material of the cutting tool at a temperature thereof which permits a catalytic reaction to take place owing whereto the content of the non-metallic component falls within the boundaries of a region wherein the compound with the high thermodynamic stability is homogenous.

12 Claims, No Drawings

WEAR RESISTANT COATING OF CUTTING TOOL AND METHODS OF APPLYING SAME

This is a division of application Ser. No. 869,185, filed May 30, 1986, now U.S. Pat. No. 4,753,854.

FIELD OF THE INVENTION

The present invention relates to metal working in general and to cutting tools in particular, having specific reference to wear-resistant coatings of tools and methods of applying same.

The invention may have utility in manufacturing not only cutting tools but drills and milling cutters as well, including those which are subjected to rapid wear.

BACKGROUND OF THE INVENTION

To make coated cutting tools last longer, the performance of the coating is improved among other things. In connection with this, the coatings with an interstitial phase (interstitial alloy) hold out a special promise, for they posses hardness of a high order.

Known in the art is a wear-resistant coating for cutting tools and a method of applying same (cf. Patent of FRG No. 1,959,690; priority Nov. 28, 1969; IPC C23C 11/08, published June 3, 1971) the interstitial phases whereof are carbon nitrides of the metals falling under the groups IVa-VIa of the Periodic Table of the Elements. The base metal of the tools given the above coating is a hard alloy, for example tungsten carbide (WC). The coating is deposited from a gaseous phase, and the base metal must be therefore heated to a temperature as high as 1000° C. which may cause a hard alloy to lose some of its strength. However, the known coating cannot be applied by the known method to cutting tools the base metal whereof is a low-melting point one, e.g. steel. Said coating is based on carbon nitrides and contains one of the metals of the groups IVa-VIa of the Periodic Table of the Elements. To give the coating extra hardness and wear-resistance, alloying components may be introduced thereinto.

Also known is a wear-resistant coating for cutting tools having at least a single layer of an interstitial phase which is applied to the base and comprises alloying components as well as a non-metallic component the content whereof varies over the thickness of the coat (cf. Fizika i khimia obtrabotki materialov, izdatelstvo Nauka, No. 2, pp. 169-170).

The interstitial phase formed, which is the coating, is based on molybdenum carbides and contains alloying components in the form of titanium, zirconium and tungsten. The main components of the interstitial phase, i.e. molybdenum and carbon react in the coating to form molybdenum carbide and molybdenum monocarbide (MoC). This means that a thermodynamically stable phase $Mo_2C$ exists in a layer of coating together with an unstable one, e.g. MoC.

During machining, when the temperature of the cutting tool may rise to between 600° and 1000° C., the thermodynamically unstable compound of the heterogenous phase composition of the coating decomposes into the constituent elements (molybdenum and carbon), whereby $Mo_2C$ is formed. This transformation taking place in the coating during machining sets up high stresses which render the coating brittle and susceptible to flaking and chipping. The service life of the tool is consequently reduced.

Further known is a method of applying a wear-resistant coating to a cutting tool which resorts to ionic bombardment in order to condense matter and consists in striking an electric arc in a vacuum to evaporate the material of a cathode, applying a bias voltage to the base metal of the cutting tool, heating up and cleaning the base metal by the bombarding ions of the vapourized cathode material, decreasing the bias voltage to a value whereat a layer of coating is formed, and lowering the temperature of base metal at the same time, feeding into the vacuum a gas which reacts with the evaporated cathode material to form a layer of coating of a given thickness which consists of an interstitial phase (cf. Fizika i khimia obrabotki materialov, izdatelstvo Nauke, No. 2, 1979, pp. 169-170).

The period elapsed in depositing a layer of coating with a thickness of 5-8 $\mu$m is between 45 and 60 min as a rule during the process of coating a tool. Since the reactivity of the main components of the interstitial phase decreases during this interval, thermodynamically unstable compounds ar e formed together with the stable ones. Moreover, since the temperature of depositing the coating is 420° C. in this case, the diffusion of the gas into the base metal occurs at too high a rate. As a result, the content of the non-metallic component of the interstitial phase forming the coating is low, and thermodynamically unstable compounds detrimental to the strength of the coating are formed from the reaction with the evaporated cathode material.

SUMMARY OF THE INVENTION

It is an object of the invention to provide a durable, wear-resistant coating and develop a method of applying same for the purpose of extending the service life of tools.

This object is realized in a wear-resistant coating for a cutting tool comprising at least a single layer of an interstitial phase (interstitial alloy) which is applied to the base material and contains alloying components as well as a non-metallic one that is distributed nonuniformly over the thickness of the layer. According to the invention, the content of the non-metallic component in the interstitial phase falls within the boundaries of a region wherein a compound of the interstitial phase which is characterized by the greatest thermodynamic stability is homogenous, whereby at least one of the alloying components functions as a catalyst facilitating formation of the compound with the highest thermodynamic stability to form.

It is expedient that secondary layers are provided in the wear-resistant coating which alternate with primary ones, being of a corresponding number, and are formed each of the interstitial phase containing the non-metallic component in an amount falling within the boundaries of a region wherein the compound of this phase characterized by the greatest thermodynamic stability is homogenous, whereby at least one alloying component of the interstitial phase in a preceding primary layer functions as the catalyst which facilitates formation of the compound with the high thermodynamic stability to form in the succeeding secondary layer.

The catalyst used to form the compound with the highest thermodynamic stability in the interstitial phase of coating is molybdenum when this phase is based on titanium nitride or titanium oxicarbide or titanium carbide or titanium diboride or chromium nitride or niobium carbonitride.

The catalyst used to form the compound with the high thermodynamic stability in the interstitial phase of coating is magnesium when this phase is based on aluminium nitride.

The catalyst used to form the compound with a high thermodynamic stability in the interstitial phase of coating is niobium when this phase is based on molybdenum carbide or molybdenum carbonitride.

The object of the invention is also realized by a method of applying a wear-resistant coating to a cutting tool which resorts to ionic bombardment in order to condense matter and consists in striking an electric arc in a vacuum to evaporate the material of a cathode, applying a bias voltage to the base material of the cutting tool, heating up and cleaning the base material by the bombarding ions of the vapourized cathode material, decreasing the bias voltage to a value whereat a layer of coating can be formed and lowering the temperature of the base material at the same time, feeding into the vacuum a gas that reacts with the evaporated cathode material until a layer of coating of a given thickness is formed which consists of an interstitial phase. According to the invention, a catalyst is introduced into the vacuum by evaporating the material of a cathode which facilitates formation of a compound with the high thermodynamic stability to form in the interstitial phase consisting whereof is the deposited layer and the temperature of the base material of the cutting tool during the deposition of the layer which enables a catalyst reaction to give rise to the compound with the high thermodynamic stability to take place in the interstitial phase of the layer also provides for diffusion of the gas into the base material of the cutting tool owing whereto the content of the non-metallic component falls within the boundaries of a region wherein the compound with the high thermodynamic stability is homogenous.

It is preferred to heat up the base material of the cutting tool for depositing a layer of coating thereupon to 350°–400° C. when the base material is high-speed cast steel or to 300°–350° C. when the base material is high-speed steel powder or to 550°–650° C. when the base material is a non-metallic refractory composition.

It is also preferred to use a molybdenum-containing titanium alloy as the material of the cathode when the interstitial phase of which a layer of coating is formed is based on titanium nitride or titanium carbide or titanium oxicarbide or titanium diboride; or to use a molybdenum-containing chromium alloy when the interstitial phase is based on chromium nitride; or to use a molybdenum-containing niobium alloy when the interstitial phase is based on niobuim carbonitride; or to use a magnesium-containing aluminium alloy when the interstitial phase is based on aluminum nitride; or to use a niobium-containing molybdenum alloy when the interstitial phase is based on molybdenum carbide or molybdenum carbon nitride.

A wear-resistant coating for cutting tools, a single- or multilayer one, which is deposited from the components of the interstitial phase having high thermodynamic stability, that is from those formed under the conditions of a maximum change in enthalpy ($-\Delta H°$), displays a mechanical strength and a two-to fourfold increase in durability conductive to extended service life of the tool.

The disclosed method of applying a wear-resistant coating to cutting tools permits one to produce a coating with the above properties each layer whereof consists of a compound with high thermodynamic stability without increasing the cost or duration of the process or increasing the requirements for scarce materials.

Specific embodiments of the invention will now be described by way of an example. Advantages of the invention will become obvious from this description.

DETAILED DESCRIPTION OF THE INVENTION

The disclosed wear-resistant coating for cutting tools comprises at least a single layer of an interstitial phase (interstitial alloy). As is known the interstitial phase is a high-melting point compound formed from a transition metal and a non-metal or several non-metals, e.g. C, N, O and B.

The number, thickness, composition and sequence of layers may vary over a wide range which is known in the art and is decided by the requirements to be met by the tool and service conditions.

A coating with a multilayer structure can combine the properties intrinsic to the various interstitial phases of which the individual layers are formed.

The physical and mechanical properties of the interstitial phase is improved by introducing therein alloying components in the form of such metals as magnesium, molybdenum, tungsten, niobium, chromium and vanadium. At least one of the alloying components must function as a catalyst formation of a compound with the thermodynamic stability to form. In other words, every layer of the coating is formed from an interstitial phase the content of the non-metallic component whereof falls within the boundaries of a region wherein the compound with an all-best thermodynamic stability is homogenous.

The method of applying a wear-resistant coating to a cutting tool which resorts to ionic bombardment in order to condense matter consists in the following.

Cutting tools the base material whereof has been cleaned of oxide films and other contaminations in advance are loaded into a vacuum chamber which is fitted with cathodes of a number equalling that of the interstitial phases which will form the layers of the coating. The material of every cathode is a transition metal and the alloying components of the corresponding interstitial phase of a layer of the coating. The chamber can be fitted with an extra cathode used only for the cleaning and heating up the base metal. Another extra-cathode can be provided for in a material containing a catalyst which facilitates formation of a compound with high thermodynamic stability to form in an interstitial phase.

On being loaded with tools, the chamber is evacuated and an electric arc is struck therein to evaporate the material of the cathodes. At first, the base material is cleaned and heated up. For this, a bias voltage is applied to the base material. If no cathode is available which is employed for heating up and cleaning the base material, the cathode used for depositing the first layer of coating is evaporated.

The ions of the evaporated cathode material bombard the base material, cleaning and heating it up to a temperature not detrimental to its strength. The bias voltage is lowered to a value which permits the evaporated cathode material to condense on the base metal, cooling this and for the base metal to cool down. At the same time, the reduced bias voltage must maintain the temperature of the base metal at a level which enables a layer of the coating to be deposited thereupon. A gas admitted into the chamber reacts with the evaporated cathode material to form an interstitial phase of which the layer of coating is made up. A catalyst is introduced into the chamber to facilitate a compound with high thermodynamic stability to form in the interstitial phase.

Owing to the catalyst, the concentration of the non-metallic component of a layer of coating deposited under the conditions of disequilibrium can be maintained over the thickness of the layer within in the boundaries of a region wherein the compound with the high thermodynamic stability is homogenous.

The catalyst can be either introduced into the material of the cathode used to deposit the coating or the extra cathode made of a material containing the catalyst can be evaporated. During the process of coating, the temperature of the base material is maintained at a level which permits a catalytic reaction giving rise to a compound with a high thermodynamic stability to take place in an interstitial phase. This temperature also provides for a diffusion of the gas into the base material with the result that the content of the non-metallic component in an interstitial phase falls within the boundaries of a region wherein the compound with the greatest thermodynamic stability is homogenous. The temperature of the process should be sufficiently high for the compound with the greatest thermodynamic stability to form on the surface of the base material but it should be less than the temperature whereat the gas diffuses into the base material at such a high rate that the amount of the gas present at the surface of the base material is insufficient for the compound with the greatest thermodynamic stability to form there. The process temperature is determined experimentally for each particular base material.

The gas commonly used during the process is nitrogen or methane or oxygen or borane or silane. The thickness of the layer is decided by the period during which the gas is admitted into the chamber. On obtaining a given thickness, the chamber is disconnected from the source of the gas, the bias voltage is removed, the electric arc is extinguished and the tools are allowed to cool to room temperature in the chamber.

Further details of the invention will become obvious from the following examples illustrating the way of embodying same.

EXAMPLE 1

Subjected to coating were 5-mm spiral drills made of high-speed cast steel of the following composition (wt %): C, 0.85; Cr, 3.6; W, 6.0; V, 2.0; Mo, 5.0; Fe, the balance. A 10-piece lot of degreased drills was loaded into a container which was placed into a known vacuum chamber for the ion-sputtered coating process with provision for rotation.

The chamber was provided with two cathodes, a titanium one for cleaning the drills and a cathode for depositing the coating made of a molybdenum-containing titanium alloy of the following composition (wt %): Ti, 93.0; Al, 5.0; Mo, 1.0; V, 1.0. The composition of the second cathode decided the composition of the coating. The chamber was evacuated to $6.65 \times 10^{-3}$ Pa. and an electric arc was struck therein to evaporate the cathode designed to clean the base material of the drills. A negative bias voltage as high as 1100V was applied to the drills for accelerating the positive titanium ions which bombarded the drills, cleaning and heating them up to 520° C. At the same time, the container was set rotating at a speed of 6 rpm about the cathodes. The bias voltage was lowered to 200V and the temperature of the base material, to 400° C. Simultaneously with evaporating the cathode deposited wherefrom was the coating, a gas, $N_2$, was admitted into the chamber which brought about a pressure buildup therein of up to $4 \times 10^{-1}$ Pa. The gas, reacting with the evaporated cathode material, formed an interstitial phase (Ti, Al, Mo, V) N deposited wherefrom on the base material was the coating. The content of the non-metallic component, N, in the interstitial phase was between 15.0 wt % and 22.0 wt %, that is fell within the boundaries of a region wherein a compound with high thermodynamic stability was homogenous.

The elements Al, Mo and V of the cathode deposited wherefrom was the coating were transferred into the interstitial phase as alloying components thereof, and the molybdenum also functioned as the catalyst facilitating the compound with the greatest thermydynamic stability to form.

The gas was admitted into the chamber during a period of 60 min until a single layer of wear-resistant coating with a thickness of 6 $\mu$m was deposited.

The bias voltage was removed, the flow of the gas stopped, the arc extinguished and the chamber with the drills was cooled down to room temperature.

The lot of the drills with the wear-resistant coating so deposited was tested by drilling steel of the following composition: C, 0.41-0.49 wt %; Fe, the balance. The test was carried out on an upright drilling machine, the cutting speed was V=45 m/min, the feed was S=0.18 mm/rev, the depth of drilling was l =3d, where d was the drill diameter. The drilling went on until a squeaky sound was heard, betraying bluntness of the drill. Every drill averaged 335 drillings.

EXAMPLE 2

Spiral drills from the same steel as in Example 1 were given a wear-resistant single-layer coating. The technique was essentially the same as in Example 1 with the only exception that the coating was deposited from two cathodes. One was made of a titanium base alloy (composition in wt %: Ti, 91.0; Al, 5.0; V, 4.0) and the other was made of molybdenum. The gas used was $CO_2$ which reacted with the materials of the cathodes to form an interstial phase (Ti, Al, V, Mo)CO the content of the non-metallic component whereof, that is the aggregate content of C and O, was between 14.0 wt % and 19.0 wt %, falling within the boundaries of a region wherein a compound with a high thermodynamic stability was homogeneous. The catalyst facilitating the compound with the highest thermodynamic stability to form was the molybdenum introduced in vacuum during the evaporation of the additional cathode. The high bias voltage applied initially to heat up the base material was reduced to 190 V and the temperature of the base material was 350° C. at this stage.

The test of the drills was carried out on the same lines as in Example 1, and every drill averaged 350 drillings.

EXAMPLE 3

Drills made of the same material as in Example 1 were given a multilayer coating with a total thickness of 6 $\mu$m. It comprised 500 alternating layers formed from two interstitial phases containing different alloying components. Two cathodes were employed to deposit the layers. One was made of molybdenum-containing titanium alloy (composition in wt %: Ti, 93.0; Al, 5.0; Mo, 1.0; V, 1.0) and the other, of a magnesium-containing aluminium alloy (composition in wt %: Al, 98.5; Si, 0.5; Mg, 0.5; Cu, 0.5).

The technique of depositing the coating was essentially the same as in Example 1 except that the reduced bias voltage applied after the initial heating up of the base metal was 195 V and the temperature of the base metal after cooling was 380° C.

For depositing the alternating layers of coating from two different intersititial phases, the position of the drills relative to the cathodes was changed during the process. A drill positioned within the reach of the vapor from the cathode made of the molybdenum-containing titanium alloy received a coat deposited from the interstitial phase (Ti, Al, Mo, V)N the content of the non-metallic component whereof, N, was between 15.0 wt % and 22.0 wt %, i.e. fell within the boundaries of a region wherein a compound with a high thermodynamic stability was homogenous. The catalyst facilitating this compound to form was molybdenum. A drill positioned within the reach of the vapor from the cathode of the magnesium-containing aluminium alloy received a coat consisting of the interstitial phase (Al, Mg, Cu, Si)N the content of the non-metallic component whereof was between 21.2 wt % and 21.3 wt %, i.e. fell within the boundaries of a region wherein a compound with high thermodynamic stabilty was homogenous. The catalyst facilitating this compound to from was magnesium.

The test of the drills with the wear-resistant coating so deposited was conducted on the same lines as in Example 1, and every drill average 460 drillings.

EXAMPLE 4

A lot of drills was made from the material as in Example 1 and was given a multilayer coating comprising 450 alternating layers with a total thickness of 6 μm deposited from two interstitial phases one whereof contained alloying components.

Two cathodes installed in the vacuum chamber were used to deposit the coating. One cathode was made of the molybdenum-containing titanium alloy of the composition given in Example 1 and the other cathode was made of chromium.

The conditions of the process were the same as in Example 1.

The 450-layer coating was formed from two interstitial phases by displacing the drills with respect to the cathodes as described in Example 3. The rate of displacement of the container was 5.5 rev/min.

During evaporation of the molybdenum-containing titanium alloy cathode coating layers were formed, which layers were composed from the interstital phase similar to that described in Example 1.

The evaporation of the chromium cathode resulted in the deposition of layers from the intersititial phase CrN the content of the non-metallic component whereof, N, was between 21.2 wt % and 21.5 wt %, i.e. fell within the boundaries of a region wherein a compound with high thermodynamic stability was homogenous. The catalyst which facilitated this compound to form was the molybdenum contained in the preceding layer of the coating.

The drills with the wear-resistant coating so deposited were tested as indicated in Example 1. Every drill averaged 465 drilling operations.

EXAMPLE 5

Drills made of a high-speed steel powder of the composition given in Example 1 were given a multilayer coating with a total thickness of 6 μm which comprised 500 alternating layers of two different interstitial phases both of which contained alloying components.

One of the two cathodes used to deposit the coating in a vacuum chamber was made of the same material as given in Example 1. The other cathode was made of a niobium-containing molybdenum alloy of the following composition (wt %): Ti, 1.0; Zr, 0.5; Nb, 1.5; C, 0.5; Mo, 96.5.

To accelerate the positive Ti ions which cleaned and heated up the base metal of the drills to 500° C., a negative voltage of 1000 V was applied to the drills, and the container with the drills was set revolving about the cathodes at a rate of 6 r/min.

The bias voltage was then reduced to 180 V and the temperature of the base metal was lowered to 300° C.

Simultaneously with striking an arc to evaporate the material of the cathodes, methane $CH_4$ was admitted into the vacuum chamber, increasing the pressure therein to $4 \times 10^{-1}$ Pa. The reaction between the methane and the material of the cathodes gave rise to a coating deposited on the base metal from two alternating interstitial phases (Ti, Al, Mo, V)C and (Mo, Ti, Zr, Nb)$_2$C.

The alloying components of the (Ti, Al, Mo, V)C interstitial phase were Al, Mo, and V. The molybdenum served as the catalyst facilitating the formation of a compound with high thermodynamic stability which contained the non-metallic component, C, in an amount between 12.5 wt % and 19.0 wt %, i.e. falling within the boundaries of a region wherein this compound with high thermodynamic stability were homogenous.

The alloying components of the (Mo, Ti, Zr, Nb)$_2$C interstitial phases were Ti, Zr and Nb. The last-named element served as the catalyst facilitating the formation of a compound with high thermodynamic stability which contained the non-metallic component, C, in an amount between 5.5 wt % and 5.8 wt %, i.e. falling within the boundaries of a region wherein the compound with an high teremodynamic stability was homogenous.

The coating with the specified thickness of 6 μm was formed during an internal of 60 min. After that the bias voltage applied to the base material was removed, the flow of the methane into the chamber was stopped, the arc was extinguished and the chamber with the drills was allowed to cool down to room temperature.

The drills were tested in the same way as in Example 1. Every drill average 290 drillings.

EXAMPLE 6

Drills made of a high-speed steel powder of the composition given in Example 1 were overlaid with a coating consisting of 500 alternating layers of two different interstitial phases which were obtained from two cathodes of the compositions given in Example 5. The gas used was $N_2$. A negative bias voltage are 1000V was applied to the drills and their base material was heated up to 500° C. The bias voltage was then reduced to 190 V and the temperature of the base material lowered to 350° C.

The coating applied to the base material consisted of alternating layers of two interstitial phase. One of them for the phase (Ti, Al, Mo, V)N, i.e. the same as described in Example 1. The other phase, (Mo, Ti, Zr, Nb)$_2$CH, contained the non-metallic component CN in an amount of 6.5 or 6.6 wt % which was one falling within the boundaries of a region wherein a component with an high thermodynamic stability was homogenous.

The alloying components of this phase were Ti, Zr, Nb, whereby the last-named element was the catalyst owing to which the component with an high thermodynamic stability was formed.

The lot of the drills so coated was tested as indicated in Example 1. Every drill averaged 410 drillings.

EXAMPLE 7

The material of the tools and the composition of the coating applied were the same as in Example 6 but the bias voltage was lowered to 185 V for deposting the coating, whereby the temperature of the base material decreased to 320° C.

The drills were tested as indicated in Example 1 and each of them averaged 380 drillings.

EXAMPLE 8

A 10-piece lot of boron nitride tool tips with a Vickers hardness number of 5500 to 9500 received a single-layer wear-resistance coating of the kind described in Example 1. However, unlike Example 1, only one cathode made of a molybdenum-containing titanium alloy (composition in wt %: Mo, 1.0; Al, 5.00; V, 1.0; Zr, 2.0; Ti, 91.0) was used for cleaning and heating up the base material and for depositing the coating. A bias voltage of 1500 V was applied to the base material, heating this up to 680° C. The bias voltage was then reduced to 280 V, whereby the temperature of the base decreased to 550° C. The gas used was $N_2$ which reacted with the evaporated material of the cathode to form on the base material an interstitial phase (Ti, Mo, Al, V, Zr)N the non-metallic component, N, whereof was present in an amount between 15.5 wt % and 22.0 wt %. i.e., one which fell between the boundaries of a region wherein a compound with high thermodynamic stability was homogenous.

The alloying components of the phase obtained were Mo, Al, V, Zr, and the molybdenum was the catalyst facilitating information of the compound with an high thermodynamic stability.

The coated tips were fitted to boring tools and used to finish bores of blanks chucked in the spindle head of a machine tool. The material bored was steel of the following composition (wt %): C, 0.36–0.44; Si, 0.17–0.37; Mn, 0.50–0.80; Cr, 0.80–1.10; F, the balance. The spindle speed was 1000 r/min, the feed was 0.3 mm/rev and the stock machined was 0.5 mm.

The number of blanks machined by a tip before its performance deteriorated below a specified rating decided tip durability. It was 140 bearings per tip of the average.

EXAMPLE 9

A 10-piece lot of tips made of high-melting point alloy $TiB_2$ with a Rockwell. A hardness of 86–92 was given a single-layer wear-resistant coating analogous to that described in Example 1. However, the material of the cathode from which the coating was deposited was molybdenum-containing niobium alloy of the following composition (wt %): Mo, 4.0; Zr, 1.0; C, 0.12; Nb, 94.88. A bias voltage of 1500 V was applied to the base material, heating same up to 680° C., and then reduced to 350 V so that the temperature lowered to 650° C. The gas used was nitrogen which reacted with the material of the cathode to form an interstitial phase (Nb, Zr, Mo)$_2$CN on the base material the contact of the non-metallic component, CH, which was between 6.0 wt % and 7.0 wt %, i.e. fell within the boundaries of a region wherein a compound with height thermodynamic stability was homogeneous.

The alloying components of the interstitial phase so obtained were Mo and Zr, whereby the molybdenum was also the catalyst which facilitated the compound with high thermodynamic stability to form.

The tips of the lot were tested as indicated in Example 8, and the number of borings per tip averaged 100.

EXAMPLE 10

A 10-piece lot of tips made of a high-melting point alloy TiC with a Rockwell. A hardness of 88–94 was given a single-layer coating analogous to that referred to in Example 1. However, the material of the cathode deposited wherefrom was the coating was a molebdenum-containing titanium alloy of the following composition (wt %): Al, 5.0; Mo, 1.0; V, 1.0; Zr, 2.0; Ti, 91.0).

A bias voltage of 1500 V was applied to the base material, heating same up to 680° C., and then reduced to 300 V so that the temperature lowered to 600° C. The gas used was borane, $B_4H_{10}$, which reacted with the evaporated material of the cathode to form an interstitial phase (Ti, Al, Mo, V, Zr)$B_2$ on the base material the content of the non-metallic component, $B_2$, whereof was 31.0 to 31.3 wt %, i.e. fell within the boundaries of a region wherein a compound with an all-best thermodynamic stability was homogenous. The alloying components of the interstitial phase so obtained were Al, Mo, V, Zr, and the molbdenum was also the catalyst which facilitated the compound with an all-best thermodynamic stability to form.

The tips comprising the lot were tested as in Example 8, and the number of borings averaged 160 per tip.

What is claimed is:

1. A method of applying a wear-resistant coating having a homogeneous interstitial phase to a cutting tool utilizing ionic bombardment which comprises
   (a) evaporating a cathode material by an electric arc in a vacuum deposition zone to form metallic ions of the cathode material;
   (b) applying a bias voltage to the cutting tool in the vacuum deposition zone;
   (c) heating and cleaning said cutting tool with bombarding ions of said cathode which is being evaporated;
   (d) decreasing said bias voltage to a value at which said coating can be formed on said cutting tool and the temperature of said cutting tool is lowered at the same time to a temperature for a catalytic reaction for formation of a homogeneous interstitial phase;
   (e) bombarding the cutting tool at the decreased bias voltage with said metallic ions of the at least one metal which form an interstitial phase with the non metal reactant;
   (f) introducing a non-metal reagent gas into said vacuum deposition zone; introducing a catalyst into said vacuum comprising the catalyst whereby said gas reacts with the ions of the at least one metal in the presence of said catalyst to form a layer of an interstitial phase compound having high thermodynamic stability; and
   (g) depositing a coating which is formed by the reaction of the metal ions with the non-metal reagent gas, in the presence of the catalyst to form a compound having the highest thermodynamic stability, wherein the catalyst and the compound are selected from the following combinations:
  (i) when the catalyst contains molybdenum the compound is selected from the group consisting of titanium nitride, titanium oxicarbide, titanium carbide, titanium diboride, chromium nitride and niobium carbonitride;
  (ii) when the catalyst contains niobium the compound is molybdenum carbide or molybdenum carbonitride; and
  (iii) when the cataylst contains magnesium, the compound is aluminum nitride.

2. A method of claim 1 wherein said non-metal reagent gas comprises nitrogen and said catalyst is introduced by evaporating a cathode made of a molybdenum-containing chromium alloy, to form an interstitial phase containing chromium nitride.

3. A method of claim 1 wherein said non-metal reagent gas comprises nitrogen and said catalyst is introduced by evaporating a cathode made of a molybdenum-containing niobium alloy to form an interstitial phase containing niobium carbonitride.

4. A method of claim 1 wherein said non-metal reagent gas comprises nitrogen and said catalyst is introduced by evaporating a cathode made of a magnesium-containing aluminum alloy to form an interstitial phase containing aluminum nitride.

5. A method of claim 1 wherein said non-metal reagent gas comprises nitrogen and said catalyst is introduced by evaporating a cathode made of a niobium-containing molybdenum alloy to form an interstitial phase containing molybdenum carbide or molybdenum carbonitride.

6. A method of applying a wear-resistant coating to a cutting tool as claimed in claim 1 wherein said coating is deposited on said cutting tool of 350° C.–400° C. when said cutting tool comprises high-speed cast steel.

7. A method of applying a wear-resistant coating to a cutting tool as claimed in claim 1 wherein said coating is deposited on said cutting tool at a temperature of said cutting tool of 300° C.–350° C. when said cutting tool comprises high-speed steel powder.

8. A method of applying a wear-resistant coating to a cutting tool as claimed in claim 1 wherein said coating is deposited on said cutting tool at a temperature of said cutting tool of 550° C.–650° C. when said cutting tool comprises a non-metallic refractory composition.

9. A method of applying a wear-resistant coating to a cutting tool as claimed in claim 1 wherein said coating interstitial phase comprises a compound selected from the group consisting of titanium nitride, titanium carbide, titanium oxycarbide and titanium diboride; and said material of said cathode is a molybdenum-containing titanium alloy.

10. A method of claim 1 wherein the ions of a metal which forms an interstitial phase comprises chromium, the gas comprising the nitrogen, the catalyst comprises molybdenum and the interstitial phase comprises chromium nitride.

11. A method of claim 1 wherein the ions of the at least one metal are provided by forming an arc with an alloy of the at least one metal.

12. A method of claim 11 wherein the catalyst is at least one of the metals contained in the alloy of the at least one metal.

* * * * *